United States Patent
Lopatin

(12) 
(10) Patent No.: US 6,486,560 B1
(45) Date of Patent: Nov. 26, 2002

(54) SEMICONDUCTOR DEVICE FABRICATED BY A METHOD OF REDUCING ELECTROMIGRATION IN COPPER LINES BY FORMING AN INTERIM LAYER OF CALCIUM-DOPED COPPER SEED LAYER IN A CHEMICAL SOLUTION

(75) Inventor: Sergey Lopatin, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/041,926

(22) Filed: Jan. 7, 2002

Related U.S. Application Data

(62) Division of application No. 09/728,685, filed on Nov. 30, 2000, now Pat. No. 6,358,848.

(51) Int. Cl.[7] .......................... H01L 23/48; H01L 23/52; H01L 29/40
(52) U.S. Cl. ....................... 257/762; 257/750; 257/758; 257/761; 438/622; 438/625; 438/638; 438/678
(58) Field of Search ................................. 438/687, 622, 438/678, 638, 625, 627, 628, 629; 257/762, 751, 741, 750, 752, 753, 758, 761, 767, 774, 775, 773

(56) References Cited

U.S. PATENT DOCUMENTS 6,181,012 B1 * 1/2001 Edelstein et al. ........... 257/751
6,417,566 B1 * 7/2002 Wang et al. ................. 257/750
6,420,258 B1 * 7/2002 Chen et al. ................. 438/622

* cited by examiner

Primary Examiner—Tuan H. Nguyen
Assistant Examiner—Thanhha Pham
(74) Attorney, Agent, or Firm—LaRiviere, Grubman & Payne, LLP

(57) ABSTRACT

A semiconductor device fabricated by a method of reducing electromigration in Cu interconnect lines by forming an interim layer of Ca-doped copper seed layer lining a via in a chemical solution. The method reduces the drift velocity, thereby decreasing the Cu migration rate in addition to void formation rate. The method comprises: depositing a Cu seed layer in the via; treating the Cu seed layer in a chemical solution, selectively forming a Cu—Ca—X conformal layer on the Cu seed layer, wherein X denotes at least one contaminant; and processing the Cu—Ca—X conformal layer, effecting a thin Cu—Ca conformal layer on the Cu seed layer; annealing the thin Cu—Ca conformal layer onto the Cu seed layer, removing the at least one contaminant, thereby forming a contaminant-reduced Cu—Ca alloy surface on the Cu seed layer; electroplating the contaminant-reduced Cu—Ca alloy surface with Cu, thereby forming a contaminant-reduced Cu—Ca/Cu interconnect structure; annealing the at least one contaminant-reduced Cu—Ca/Cu interconnect structure, thereby forming at least one virtually void-less and contaminant-reduced Cu—Ca/Cu interconnect structure; and chemical mechanical polishing the at least one virtually void-less and contaminant-reduced Cu—Ca/Cu interconnect structure in the semiconductor device.

12 Claims, 6 Drawing Sheets

US 6,486,560 B1

SEMICONDUCTOR DEVICE FABRICATED BY A METHOD OF REDUCING ELECTROMIGRATION IN COPPER LINES BY FORMING AN INTERIM LAYER OF CALCIUM-DOPED COPPER SEED LAYER IN A CHEMICAL SOLUTION

RELATED APPLICATION(S)

This application is a divisional application, claiming priority from copending U.S. patent application Ser. No. 09/728,685, filed Nov. 30, 2000, now U.S. Pat. No. 6,358, 848. This divisional application is also related to the following commonly assigned applications which have been concurrently filed with the priority document:

(1) U.S. patent application Ser. No. 09/728,313, entitled "Chemical Solution for Cu—Ca—O Thin Film Formations on Cu Surfaces;"

(2) U.S. patent application Ser. No. 09/728,315, entitled "Method of Forming Cu—Ca—O Thin Films on Cu Surfaces in a Chemical Solution and Semiconductor Device Thereby Formed," now U.S. Pat. No. 6,291, 348, issued Sep. 18, 2001;

(3) U.S. patent application Ser. No. 09/728,314, entitled "Method of Calcium Doping a Cu Surface Using a Chemical Solution and a Semiconductor Device Thereby Formed;"

(4) U.S. patent application Ser. No. 09/728,312, entitled "Method of Reducing Carbon, Sulphur, and Oxygen Impurities in a Calcium-Doped Cu Surface and a Semiconductor Device Thereby Formed;" and (5) U.S. patent application Ser. No. 09/728,684, entitled "Method of Reducing Electromigration in Copper Lines by Calcium-Doping Copper Surfaces in a Chemical Solution and Semiconductor Device Thereby Formed."

TECHNICAL FIELD

The present invention relates to semiconductor devices and their methods of fabrication. More particularly, the present invention relates to the processing of copper interconnect material and the resultant device utilizing the same. Even more particularly, the present invention relates to reducing electromigration in copper interconnect lines by doping their surfaces with barrier material using wet chemical methods.

BACKGROUND OF THE INVENTION

Currently, the semiconductor industry is demanding faster and denser devices (e.g., 0.05-$\mu$m to 0.25-$\mu$m) which implies an ongoing need for low resistance metallization. Such need has sparked research into resistance reduction through the use of barrier metals, stacks, and refractory metals. Despite aluminum's (Al) adequate resistance, other Al properties render it less desirable as a candidate for these higher density devices, especially with respect to its deposition into plug regions having a high aspect ratio cross-sectional area. Thus, research into the use of copper as an interconnect material has been revisited, copper being advantageous as a superior electrical conductor, providing better wettability, providing adequate electromigration resistance, and permitting lower depositional temperatures. The copper (Cu) interconnect material may be deposited by chemical vapor deposition (CVD), plasma enhanced chemical vapor deposition (PECVD), sputtering, electroless plating, and electrolytic plating.

However, some disadvantages of using Cu as an interconnect material include etching problems, corrosion, and diffusion into silicon.[1] These problems have instigated further research into the formulation of barrier materials for preventing electromigration in both Al and Cu interconnect lines. In response to electromigration concerns relating to the fabrication of semiconductor devices particularly having aluminum-copper alloy interconnect lines, the industry has been investigating the use of various barrier materials such as titanium-tungsten (Ti—W) and titanium nitride (TiN) layers as well as refractory metals such as titanum (Ti), tungsten (W), tantalum (Ta), and molybdenum (Mo) and their silicides.[2] Although the foregoing materials are adequate for Al interconnects and Al-Cu alloy interconnects, they have not been entirely effective with respect to all-Cu interconnects. Further, though CVD has been conventionally used for depositing secondary metal(s) on a primary metal interconnect surface, CVD is not a cost-effective method of doping Cu interconnect surfaces with calcium (Ca) ions. Therefore, a need exists for a method of reducing electromigration in Cu interconnect lines by forming an interim protective layer from a chemical solution and a semiconductor device thereby formed.

[1] Peter Van Zant, Microchip Fabrication: A Practical Guide to Semniconductor Processing, 3rd Ed., p. 397 (1997).
[2] Id., at 392.

BRIEF SUMMARY OF THE INVENTION

Accordingly, the present invention provides a method of reducing electromigration in Cu interconnect lines by forming an interim layer of Ca-doped copper seed layer lining a via in a chemical solution and a semiconductor device thereby formed. The present invention method reduces electromigration in Cu interconnect lines by decreasing the drift velocity therein which decreases the Cu migration rate in addition to void formation rate. More specifically, the present invention provides a method of fabricating a semiconductor device having reduced electromigration in its Cu interconnect lines and a device thereby formed, the method comprising: A) providing a semiconductor substrate, the substrate having at least one via formed therein, each at least one via having a volume being optionally lined with a barrier layer; B) depositing a copper (Cu) seed layer in the at least one via for facilitating subsequent formation of at least one Cu interconnect line, the Cu seed layer lining the at least one via, the Cu seed layer comprising at least one intermediate Cu layer selected from a group of intermediate copper layers consisting essentially of: (1) a blanket Cu seed layer, and (2) a partial thickness Cu plated layer; C) treating the Cu seed layer in a chemical solution, thereby selectively forming a copper-calcium-X (Cu—Ca—X) conformal layer on the Cu seed layer, wherein X denotes at least one contaminant, and D) processing the Cu—Ca—X conformal layer by a technique selected from a group of techniques consisting essentially of: (1) proceeding to step E, (2) sputtering under an argon (Ar) atmosphere, and (3) treating in a plasma ambient, thereby effecting a thin Cu—Ca conformal layer on the Cu seed layer; E) annealing the thin Cu—Ca conformal layer onto the Cu seed layer, thereby removing the at least one contaminant, whereby the thin Cu—Ca conformal layer is alloyed, and thereby forming a contaminant-reduced Cu—Ca alloy surface on the Cu seed layer; F) electroplating the Cu—Ca alloy surface with Cu for filling the volume of the at least one via, thereby forming the at least one Cu interconnect line, and thereby forming at least one contaminant-reduced Cu—Ca/Cu interconnect structure, comprising the a contaminant-reduced Cu—Ca alloy surface on the Cu seed layer, in the via; G) annealing the at least one contaminant-reduced Cu—Ca/Cu interconnect structure, thereby forming at least one virtually void-less and contaminant-reduced Cu—Ca/Cu interconnect structure; H) chemical mechanical polishing the at least one virtually void-less and contaminant-reduced Cu—Ca/Cu interconnect structure and the optional barrier layer for forming a planarized surface; and I) completing formation of the semiconductor device. The annealing step primarily removes O and secondarily removes C and S, especially when performed in an environment such as a vacuum, an inert gas, and a reducing ambient such as an ammonia ($NH_3$) plasma. Further, the present invention improves Cu interconnect reliability by enhancing electromigration resistance through impurity-level control, thereby balancing electromigration performance against low resistivity requirements.

BRIEF DESCRIPTION OF THE DRAWING

For a better understanding of the present invention, reference is made to the below-referenced accompanying drawing. Reference numbers refer to the same or equivalent parts of the present invention throughout the several figures of the drawing.

DETAILED DESCRIPTION OF THE INVENTION

Figure 1:
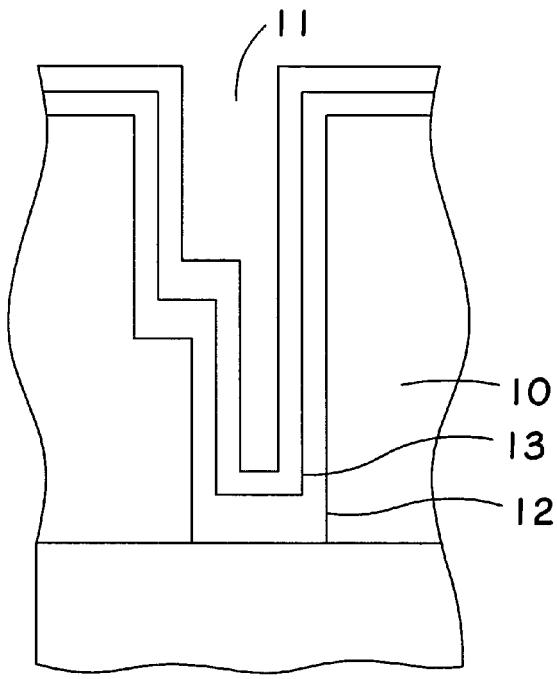
FIG. 1 is a cross-sectional view of a semiconductor substrate having formed therein a via, optionally lined with a barrier layer, the optional barrier layer having deposited a blanket Cu seed layer, for subsequent formation of a Cu interconnect line, in accordance with the present invention.

FIG. 1 is a cross-sectional view of a semiconductor substrate 10 having formed therein a via 11, optionally lined with a barrier layer 12 such as Ta, the optional barrier layer 12 having deposited a blanket Cu seed layer 13, for subsequent formation of a Cu interconnect line, in accordance with the present invention.

Figure 2:
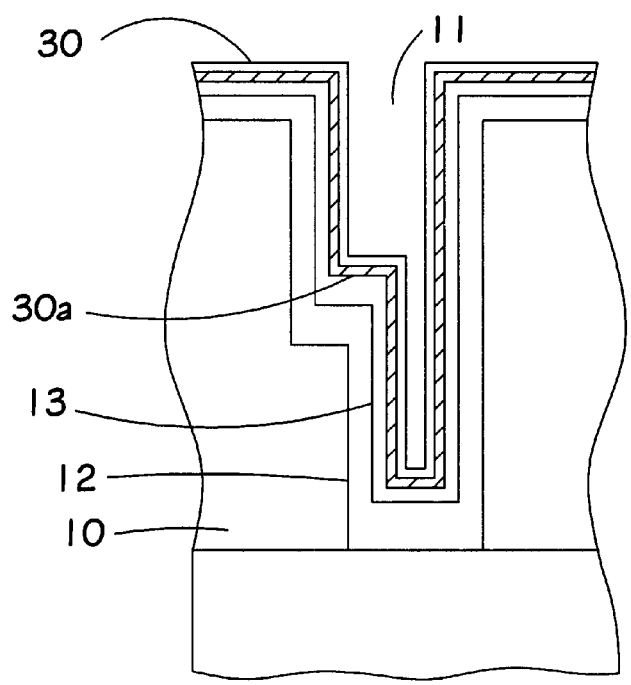
FIG. 2 is a cross-sectional view of a semiconductor substrate having formed therein a via with an optional barrier layer; the optional barrier layer having deposited a blanket Cu seed layer, as shown in FIG. 1; the blanket Cu seed layer having selectively formed thereon a Cu—Ca—X conformal layer by treating the blanket Cu seed layer in a chemical solution; the Cu—Ca—X conformal layer being optionally treated by a process such as Ar sputtering, in accordance with the present invention.

FIG. 2 is a cross-sectional view of a semiconductor substrate 10 having formed therein a via 11, optionally lined with a barrier layer 12, the optional barrier layer 12 having deposited a blanket Cu seed layer 13, for subsequent formation of a Cu interconnect line, as shown in FIG. 1, the blanket Cu seed layer 13 having selectively formed thereon a Cu—Ca—X conformal layer 30 by treating the blanket Cu seed layer 13 in a chemical solution, where contaminant X=C, S, or O; the Cu—Ca—X conformal layer 30 being optionally treated by a process such as Ar sputtering, thereby contributing to decreasing its thickness to form a thin Cu—Ca conformal layer 30a, in accordance with the present invention.

Figure 3:
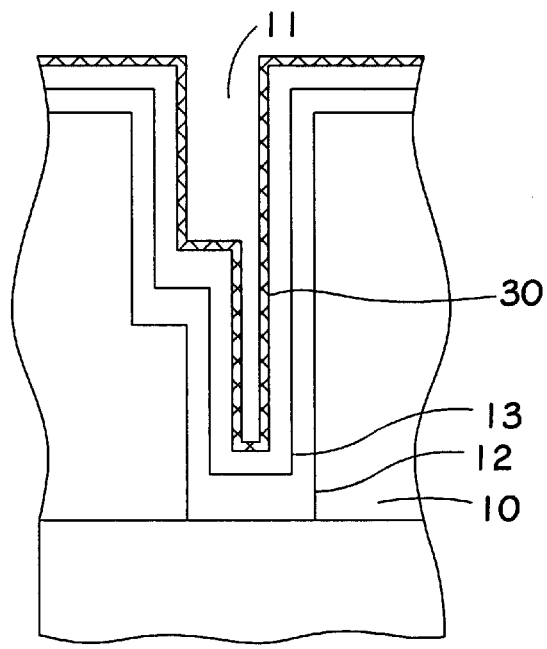
FIG. 3 is a cross-sectional view of a semiconductor substrate having formed therein a via with an optional barrier layer; the optional barrier layer having deposited a blanket Cu seed layer, as shown in FIG. 1; the blanket Cu seed layer having selectively formed thereon a Cu—Ca—X conformal layer by treating the blanket Cu seed layer in a chemical solution; the Cu—Ca—X conformal layer being optionally treated by a process such as Ar sputtering, as shown in FIG. 2, the Cu—Ca—X conformal layer being annealed onto the blanket Cu seed layer, thereby forming a contaminant-reduced Cu—Ca alloy surface on the blanket Cu seed layer, in accordance with the present invention.

FIG. 3 is a cross-sectional view of a semiconductor substrate 10 having formed therein a via 11, optionally lined with a barrier layer 12, the optional barrier layer 12 having deposited a blanket Cu seed layer 13, for subsequent formation of a Cu interconnect line, as shown in FIG. 1, the blanket Cu seed layer 13 having selectively formed thereon a Cu—Ca—X conformal layer 30 by treating the blanket Cu seed layer 13 in a chemical solution; the Cu—Ca conformal layer 30 being optionally treated by a process such as Ar sputtering, thereby contributing to decreasing its thickness to form a thin Cu—Ca conformal layer 30a, as shown in FIG. 2, the Cu—Ca—X conformal layer 30 being annealed onto the blanket Cu seed layer 13, thereby decreasing its thickness to form the thin Cu—Ca conformal layer 30a, the thin Cu—Ca conformal layer 30a being alloyed, and thereby forming a Cu—Ca alloy surface 30b on the blanket Cu seed layer 13, in accordance with the present invention.

Figure 4:
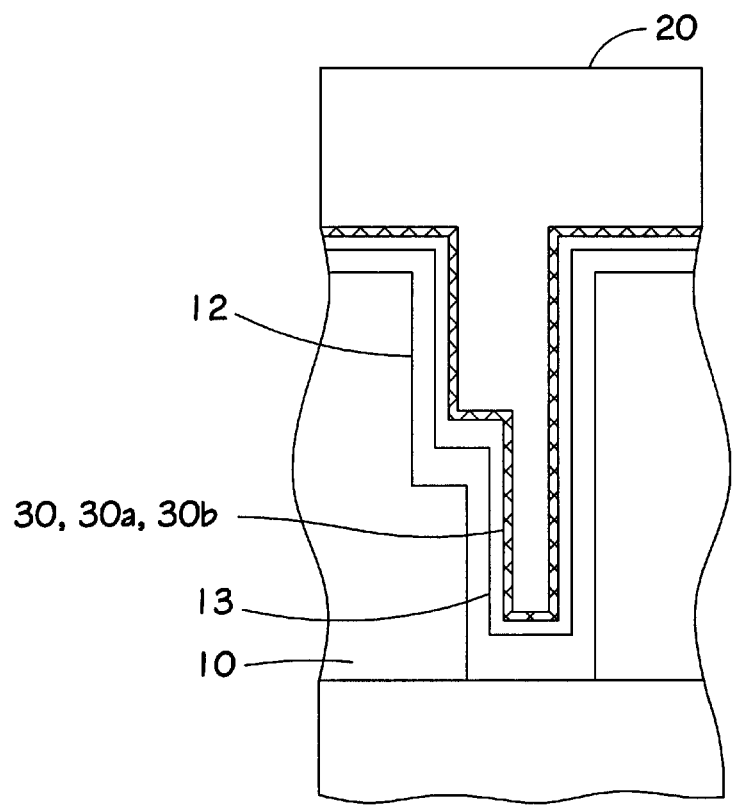
FIG. 4 is a cross-sectional view of a semiconductor substrate having formed therein a via with an optional barrier layer; the optional barrier layer having deposited a blanket Cu seed layer, as shown in FIG. 1; the blanket Cu seed layer having selectively formed thereon a Cu—Ca—X conformal layer by treating the blanket Cu seed layer in a chemical solution; the Cu—Ca—X conformal layer being optionally treated by a process such as Ar sputtering, as shown in FIG. 2, the Cu—Ca—X conformal layer being annealed onto the blanket Cu seed layer, thereby forming a contaminant-reduced Cu—Ca alloy surface on the blanket Cu seed layer, as shown in FIG. 3, the contaminant-reduced Cu—Ca alloy surface having been further electroplated with Cu for filling the via, thereby forming a Cu interconnect line; and the Cu interconnect line also being annealed, in accordance with the present invention.

FIG. 4 is a cross-sectional view of a semiconductor substrate 10 having formed therein a via, optionally lined with a barrier layer 12, the optional barrier layer 12 having deposited a blanket Cu seed layer 13, for subsequent formation of a Cu interconnect line 20, as shown in FIG. 1; the blanket Cu seed layer 13 having selectively formed thereon a Cu—Ca—X conformal layer 30 by treating the blanket Cu seed layer 13 in a chemical solution; the Cu—Ca—X conformal layer 30 being optionally treated by a process such as Ar sputtering, thereby contributing to decreasing its thickness to form a thin Cu—Ca conformal layer 30a, as shown in FIG. 2; the Cu—Ca—X conformal layer 30 being annealed onto the blanket Cu seed layer 13, thereby decreasing its thickness to form the thin Cu—Ca conformal layer 30a; the thin Cu—Ca conformal layer 30a being alloyed, and thereby forming a Cu—Ca alloy surface 30b on the blanket Cu seed layer 13, as shown in FIG. 3; the Cu—Ca alloy surface 30b having been further electroplated with Cu for filling the via 11, and thereby forming a Cu interconnect line 20; and the Cu interconnect line 20 also being annealed, in accordance with the present invention.

Figure 5:
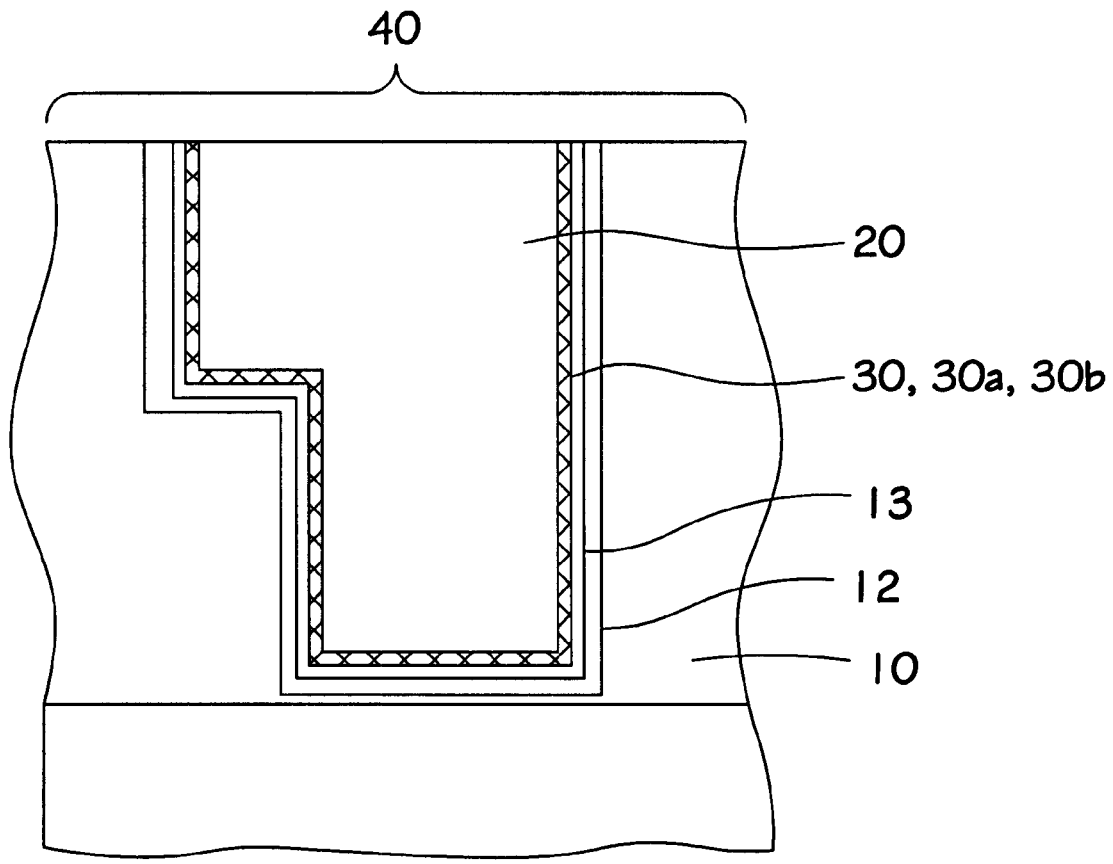
FIG. 5 is a cross-sectional view of a semiconductor substrate having formed therein a via with an optional barrier layer; the optional barrier layer having deposited a blanket Cu seed layer, as shown in FIG. 1; the blanket Cu seed layer having selectively formed thereon a Cu—Ca—X conformal layer by treating the blanket Cu seed layer in a chemical solution; the Cu—Ca—X conformal layer being optionally treated by a process such as Ar sputtering, as shown in FIG. 2, the Cu—Ca—X conformal layer being annealed onto the blanket Cu seed layer, thereby forming a contaminant-reduced Cu—Ca alloy surface on the blanket Cu seed layer, as shown in FIG. 3, the contaminant-reduced Cu—Ca alloy surface having been further electroplated with Cu for filling the via, thereby forming a contaminant-reduced Cu—Ca/Cu interconnect structure, comprising the contaminant-reduced Cu—Ca alloy surface, the contaminant-reduced Cu—Ca/Cu interconnect structure also being annealed, as shown in FIG. 4, further chemical mechanical polishing the Cu interconnect line, the Cu—Ca alloy surface, the blanket Cu seed layer, and the optional barrier layer for forming a planarized surface, thereby forming a virtually void-less and contaminant-reduced Cu—Ca/Cu interconnect structure in accordance with the present invention.

FIG. 5 is a cross-sectional view of a semiconductor substrate 10 having formed therein a via, optionally lined with a barrier layer 12, the optional barrier layer 12 having deposited a blanket Cu seed layer 13, for subsequent formation of a Cu interconnect line 20, as shown in FIG. 1; the blanket Cu seed layer 13 having selectively formed thereon a Cu—Ca—X conformal layer 30 by treating the blanket Cu seed layer 13 in a chemical solution; the Cu—Ca—X conformal layer 30 being optionally treated by a process such as Ar sputtering, thereby contributing to decreasing its thickness to form a thin Cu—Ca conformal layer 30a, as shown in FIG. 2; the Cu—Ca—X conformal layer 30 being annealed onto the blanket Cu seed layer 13, thereby decreasing its thickness to form the thin Cu—Ca conformal layer 30a; the thin Cu—Ca conformal layer 30a being alloyed, and thereby forming a Cu—Ca alloy surface 30b on the blanket Cu seed layer 13, as shown in FIG. 3; the Cu—Ca alloy surface 30b having been further electroplated with Cu for filling the via 11, and thereby forming a Cu interconnect line 20; the Cu interconnect line 20 also being annealed, thereby forming a composite interconnect structure comprising the Cu interconnect line 20, the Cu—Ca alloy surface 30b, and the blanket Cu seed layer 13, as shown in FIG. 4; and further chemical-mechanical-polishing (CMP) the Cu interconnect line 20, the Cu—Ca alloy surface 30b, the blanket Cu seed layer 13, and the optional barrier layer 12 for forming a planarized surface 40, in accordance with the present invention.

Figure 6:
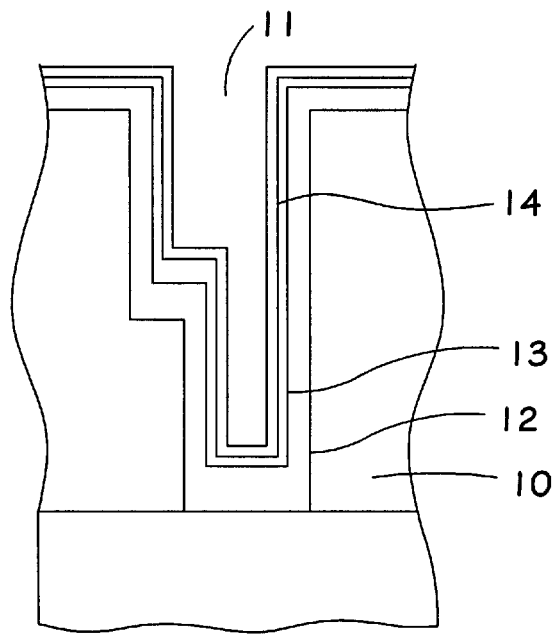
FIG. 6 is a cross-sectional view of a semiconductor substrate having formed therein a via having an optional barrier layer, the optional barrier layer having deposited a blanket Cu seed layer, as shown in FIG. 1, the blanket Cu seed layer being partially electroplated with Cu, thereby forming a partial thickness Cu plated layer, in accordance with the present invention.

FIG. 6 is a cross-sectional view of a semiconductor substrate 10 having formed therein a via 11, optionally lined with a barrier layer 12; the optional barrier layer 12 having deposited a blanket Cu seed layer 13, for subsequent formation of a Cu interconnect line 20, as shown in FIG. 1; the blanket Cu seed layer 13 being partially electroplated with Cu, thereby forming a partial thickness Cu plated layer 14, in accordance with the present invention.

Figure 7:
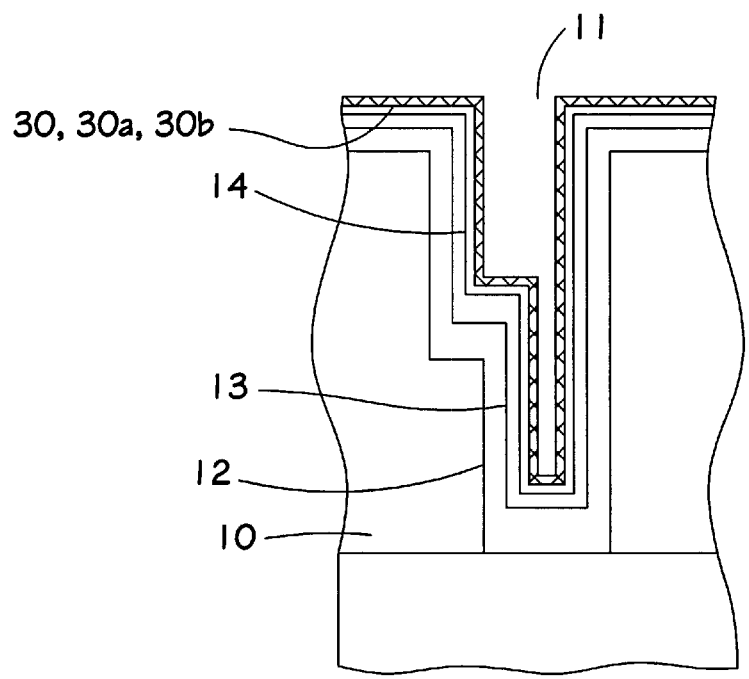
FIG. 7 is a cross-sectional view of a semiconductor substrate having formed therein a via having an optional barrier layer, the optional barrier layer having deposited a blanket Cu seed layer, as shown in FIG. 1, the blanket Cu seed layer being partially electroplated with Cu, thereby forming a partial thickness Cu plated layer, as shown in FIG. 6, the partial thickness Cu plated layer having selectively formed thereon a Cu—Ca—X conformal layer by treating the partial thickness Cu plated layer in a chemical solution, thereby forming a Cu—Ca conformal layer; the Cu—Ca conformal layer being optionally treated by a process such as Ar sputtering; the Cu—Ca—X conformal layer being annealed onto the partial thickness Cu plated layer, thereby decreasing its thickness to form a thin Cu—Ca conformal layer, and thereby forming a contaminant-reduced Cu—Ca alloy surface on the partial thickness Cu plated layer, in accordance with the present invention.

FIG. 7 is a cross-sectional view of a semiconductor substrate 10 having formed therein a via 11, optionally lined with a barrier layer 12; the optional barrier layer 12 having deposited a blanket Cu seed layer 13, for subsequent formation of a Cu interconnect line 20; the blanket Cu seed layer 13 being partially electroplated with Cu, thereby forming a partial thickness Cu plated layer 14, as shown in FIG. 6; the partial thickness Cu plated layer 14 having selectively formed thereon a Cu—Ca—X conformal layer 30 by treating the partial thickness Cu plated layer 14 in a chemical solution; the Cu—Ca conformal layer 30 being optionally treated by a process such as Ar sputtering, thereby contributing to decreasing its thickness to form a thin Cu—Ca conformal layer 30a; the Cu—Ca—X conformal layer 30 being annealed onto the partial thickness Cu plated layer 14, thereby decreasing its thickness to form the thin Cu—Ca conformal layer 30a; the thin Cu—Ca conformal layer 30a being alloyed, and thereby forming a Cu—Ca alloy surface 30b on the partial thickness Cu layer plated 14, in accordance with the present invention.

Figure 8:
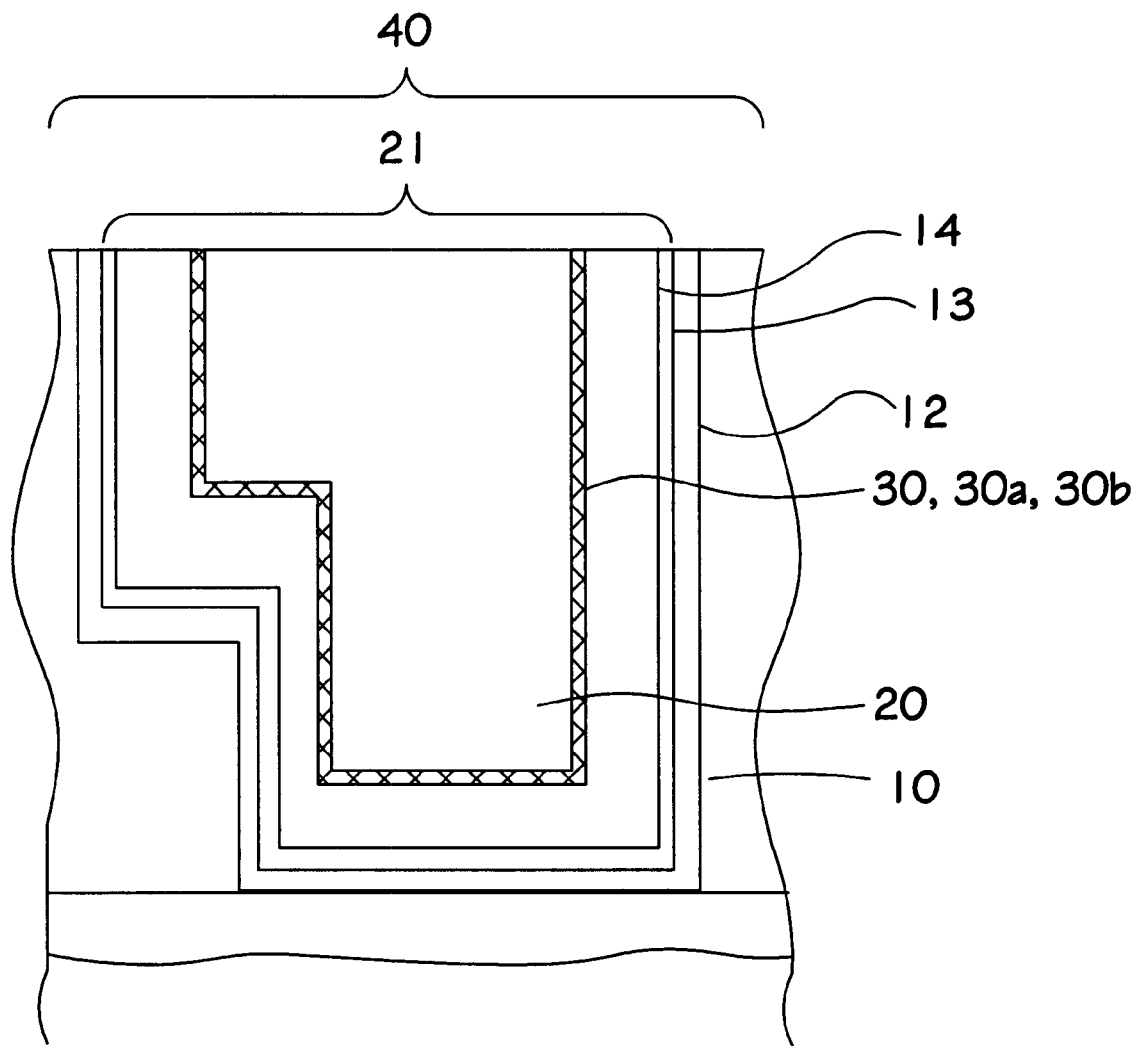
FIG. 8 is a cross-sectional view of a semiconductor substrate having formed therein a via having an optional barrier layer, the optional barrier layer having deposited a blanket Cu seed layer, as shown in FIG. 1, the blanket Cu seed layer being partially electroplated with Cu, thereby forming a partial thickness Cu plated layer, as shown in FIG. 6, the partial thickness Cu plated layer having selectively formed thereon a Cu—Ca—X conformal layer by treating the partial thickness Cu plated layer in a chemical solution, thereby forming a Cu—Ca conformal layer; the Cu—Ca conformal layer being optionally treated by a process such as Ar sputtering; the Cu—Ca—X conformal layer being annealed onto the partial thickness Cu plated layer, thereby decreasing its thickness to form a thin Cu—Ca conformal layer, and thereby forming a Cu—Ca alloy surface on the partial thickness Cu plated layer, as shown in FIG. 7, the Cu—Ca alloy surface having been further electroplated with Cu for filling the via, and thereby forming a Cu interconnect line, the Cu interconnect line also being annealed; further chemical mechanical polishing the Cu interconnect line, the Cu—Ca alloy surface, the partial thickness Cu plated layer, the blanket Cu seed layer, and the optional barrier layer for forming a planarized surface, in accordance with the present invention.

FIG. 8 is a cross-sectional view of a semiconductor substrate 10 having formed therein a via, optionally lined with a barrier layer 12; the optional barrier layer 12 having deposited a blanket Cu seed layer 13, for subsequent formation of a Cu interconnect line 20; the blanket Cu seed layer 13 being partially electroplated with Cu, thereby forming a partial thickness Cu plated layer 14, as shown in FIG. 6; the partial thickness plated Cu layer 14 having selectively formed thereon a Cu—Ca—X conformal layer 30 by treating the partial thickness plated Cu layer 14 in a chemical solution; the Cu—Ca conformal layer 30 being optionally treated by a process such as Ar sputtering, thereby contributing to decreasing its thickness to form a thin Cu—Ca conformal layer 30a; the Cu—Ca—X conformal layer 30 being annealed onto the partial thickness Cu plated layer 14, thereby forming the thin Cu—Ca conformal layer 30a, the thin Cu—Ca conformal layer 30a being alloyed, and thereby forming a contaminant-reduced Cu—Ca alloy surface 30b on the partial thickness Cu plated layer 14, as shown in FIG. 7; the contaminant-reduced Cu—Ca alloy surface 30b having been further electroplated with Cu for filling the via, and thereby forming the Cu interconnect line 20, the Cu interconnect line 20 also being annealed, thereby forming a virtually void-less contaminant-reduced Cu—Ca/Cu interconnect structure 21, the virtually voidless contaminant-reduced Cu—Ca/Cu interconnect structure 21 comprising a composite structure, the composite structure comprising the Cu interconnect line 20, the Cu—Ca alloy surface 30b, the blanket Cu seed layer 13, the partial thickness plated Cu layer 14; and further chemical-mechanical-polishing (CMP) the virtually void-less contaminant-reduced Cu—Ca/Cu interconnect structure 21 and the optional barrier layer 12 for forming a planarized surface 40, in accordance with the present invention.

Figure 9:
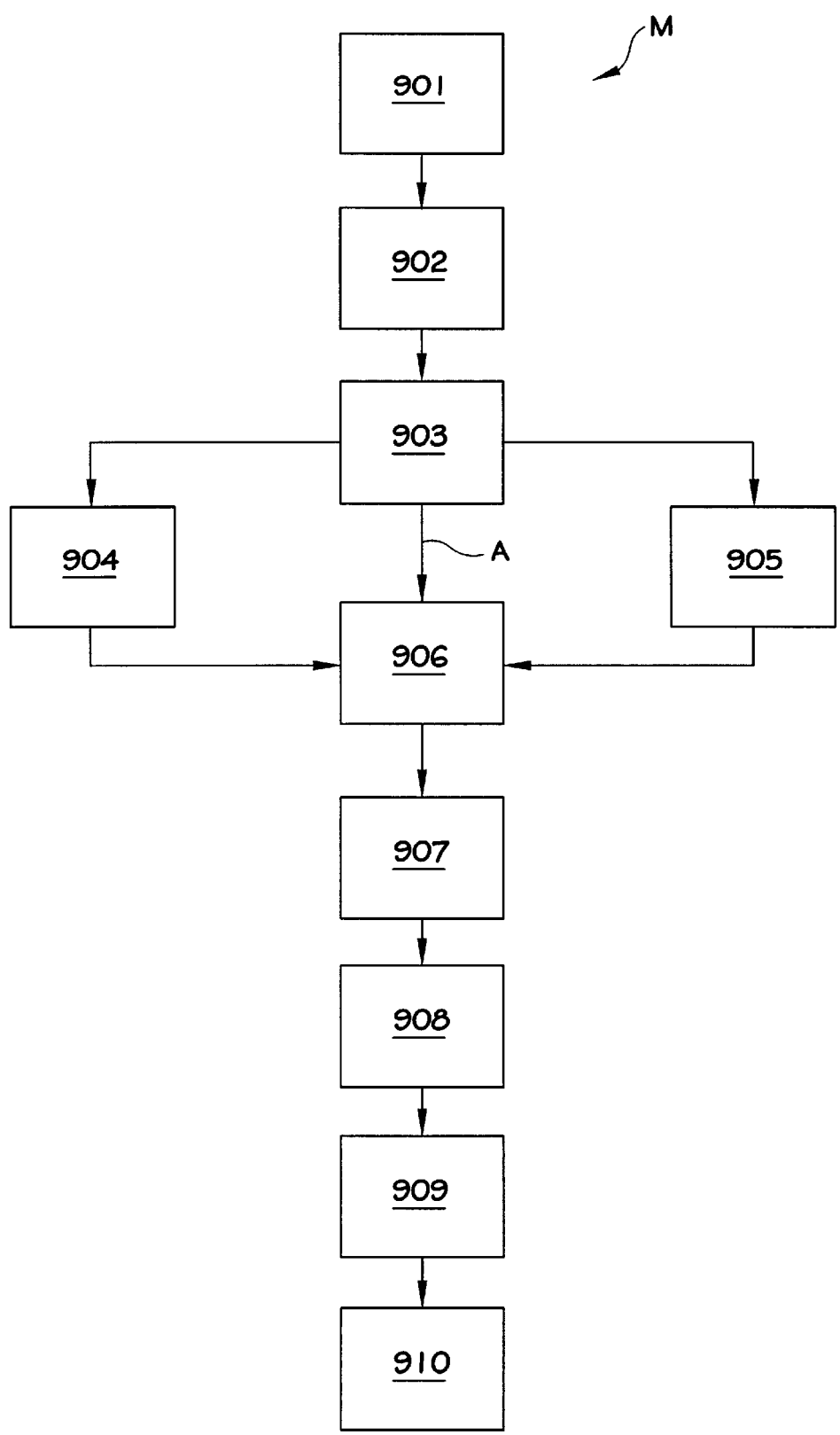
FIG. 9 is a flowchart of a method for fabricating a semiconductor device having a virtually void-less contaminant-reduced Ca—Cu/Cu interconnect line structure for reducing electromigration therein, in accordance with the present invention.

FIG. 9 is flowchart of a method M for fabricating a semiconductor device, having a virtually void-less and contaminant-reduced Cu—Ca/Cu interconnect line structure 21 for reducing electromigration therein, comprising: A) providing a semiconductor substrate 10, the substrate 10 having at least one via 11 formed therein, each at least one via 11 having a volume being optionally and partially lined with a barrier layer 12, as indicated by block 901; B) depositing a copper (Cu) seed layer in the at least one via for facilitating subsequent formation of at least one Cu interconnect line 20, the Cu seed layer lining the at least one via 11, the Cu seed layer comprising at least one intermediate Cu layer selected from a group of intermediate copper layers consisting essentially of: (1) a blanket Cu seed layer 13, and (2) a partial thickness Cu plated layer 14, as indicated by block 902; C) treating the Cu seed layer in a chemical solution, thereby selectively forming a copper-calcium-X (Ca—Cu—X) conformal layer 30 on the Cu seed layer, wherein X denotes at least one contaminant, as indicated by block 903; and D) processing the Cu—Ca—X conformal layer 30 by a technique selected from a group of techniques consisting essentially of (1) proceeding to step E, as indicated by arrow A and block 906, (2) sputtering under an Ar atmosphere, as indicated by block 904, and (3) treating in a plasma ambient, thereby removing the at least one contaminant, as indicated by block 905, contributing to forming a thin Cu—Ca conformal layer 30a on the Cu seed layer; E) annealing the thin Cu—Ca conformal layer 30a onto the Cu seed layer, thereby forming the thin Cu—Ca conformal layer 30a, whereby the thin Cu—Ca conformal layer is alloyed, and thereby forming a contaminant-reduced Cu—Ca alloy surface 30b on the Cu seed layer, as indicated by block 906; F) electroplating the contaminant-reduced Cu—Ca alloy surface 30b with Cu for filling the volume of the at least one via 11, thereby forming the at least one Cu interconnect line 20, and thereby forming at least one contaminant-reduced Cu—Ca/Cu interconnect structure, comprising the contaminant-reduced Cu—Ca alloy surface 30b, in the via, as indicated by block 907; G) annealing the at least one virtually contaminant-reduced Cu—Ca/Cu interconnect structure, thereby forming at least one virtually void-less and contaminant-reduced Cu—Ca/Cu interconnect structure 21, as indicated by block 908; H) chemical mechanical polishing the at least one virtually void-less and contaminant-reduced Cu—Ca/Cu interconnect structure 21 and the optional barrier layer 12 for forming a planarized surface 40, as indicated by block 909; and I) completing formation of the semiconductor device, as indicated by block 910, in accordance with the present invention.

The method M and devices thereby formed may also comprise additional features wherein the optional barrier layer 12 comprises tantalum (Ta); wherein the blanket Cu seed layer 13 is deposited by a technique selected from a group of techniques consisting essentially of electroplating, electroless plating, chemical vapor deposition (CVD), plasma vapor deposition (PVD), plasma enhanced chemical vapor deposition (PECVD), and atomic layer deposition (ALD); wherein the partial thickness Cu plated layer 14 is deposited by a technique comprising electroplating; wherein the Cu interconnect line 20 is dual inlaid; wherein the chemical solution comprises an electroless plating solution; wherein the electroless plating solution comprises at least one Cu salt, at least one Ca salt, at least one complexing agent, at least one reducing agent, at least one pH adjuster, and at least one surfactant; wherein the at least one contaminant is selected from a group of contaminants consisting essentially of carbon (C), sulphur (S), and oxygen (O); wherein the annealing step (E) is performed in a temperature range of 250° C. to 450° C. and under vacuum; and wherein the Cu—Ca alloy surface is Cu-rich with a Ca-doping level in a concentration range of 0.2 atomic % to 5 atomic %. The annealing step primarily removes O and secondarily removes C and S, especially when performed in an environment such as a vacuum, an inert gas, and a reducing ambient such as an ammonia ($NH_3$) plasma.

Alternatively, a device having a greater tolerance of impurities may also be formed (e.g., more impurity-tolerant applications): (1) where high levels of C and S impurities are tolerable in the Cu—Ca—X film, neither the Ar-sputtering step nor the annealing step need be performed; (2) where low levels of C and S impurities are tolerable in the Cu—Ca—X film, the annealing step need be performed; (3) where high levels of C, S, and O impurities are tolerable in the Cu—Ca film, the Ar-sputtering step need not be performed; however, (4) where low to zero levels of C, S, and O impurities are tolerable in the Cu—Ca film, the full process (i.e., method M) must be performed.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail maybe made without departing from the spirit and scope of the inventions as set forth in the appended claims. No claim herein is to be construed under the provisions of 35 U.S.C. §112, sixth paragraph, unless the element is expressly recited using the phrase "means for."

What is claimed:

1. A semiconductor device having a virtually voidless contaminant-reduced copper-calcium alloy surface on copper (Cu—Ca/Cu) interconnect structure for reducing electromigration therein, comprising:
    a semiconductor substrate, the substrate having at least one via formed therein; and
    a virtually voidless contaminant-reduced copper-calcium alloy surface on copper (Cu—Ca/Cu) interconnect structure, said interconnect structure comprising:
        a Cu seed layer deposited in the at least one via;
        a contaminant-reduced calcium-doped copper (Cu—Ca) alloy surface deposited on the Cu seed layer; and
        at least one Cu interconnect line deposited in the at least one via and over the contaminant-reduced Cu—Ca alloy surface,
    the Cu seed layer comprising a plating treatment using a chemical solution for forming a Cu—Ca—X conformal layer on the Cu seed layer, X comprising at least one contaminant, and
    the Cu—Ca—X conformal layer comprising an annealing treatment for forming the contaminant-reduced Cu—Ca alloy surface on the Cu seed layer and for facilitating forming the virtually voidless contaminant-reduced copper-calcium alloy surface on copper (Cu—Ca/Cu) interconnect structure.

2. A device, as recited in claim 1,
    wherein the Cu seed layer facilitates subsequent formation of the at least one Cu interconnect line,
    wherein the Cu seed layer comprises at least one intermediate Cu layer selected from a group of intermediate copper layers consisting essentially of:
        (1) a blanket Cu seed layer, and
        (2) a partial thickness Cu plated layer;
    wherein the blanket Cu seed layer is deposited by a technique selected from a group consisting essentially of electroplating, electroless plating, chemical vapor deposition (CVD), plasma vapor deposition (PVD), plasma enhanced chemical vapor deposition (PECVD), and atomic layer deposition (ALD),
    wherein the partial thickness Cu plated layer is deposited by a technique comprising electroplating, and
    wherein the at least one Cu interconnect line is dual inlaid.

3. A device, as recited in claim 1,
    wherein the chemical solution comprises an electroless plating solution, and
    wherein the electroless plating solution comprises:
        a. at least one solvent;
        b. at least one Cu salt;
        c. at least one Ca salt;
        d. at least one complexing agent; and
        e. at least one reducing agent, (b) through (e) being dissolved in (a).

4. A device, as recited in claim 3, wherein the electroless plating solution further comprises:
    f. at least one pH adjuster; and
    g. at least one surfactant, (f) and (g) being dissolved in (a).

5. A device, as recited in claim 4, wherein the Cu—Ca alloy surface is Cu-rich and comprises a Ca-doping level in a concentration range of 0.2 atomic % to 5 atomic %.

6. A device, as recited in claim 3, wherein the at least one contaminant is selected from a group consisting essentially of carbon (C), sulphur (S), and oxygen (O).

7. A device, as recited in claim 3, wherein the Cu—Ca alloy surface is Cu-rich and comprises a Ca-doping level in a concentration range of 0.2 atomic % to 5 atomic %.

8. A device, as recited in claim 1, wherein the annealing treatment comprises a temperature range of 250° C. to 450° C. in an environment selected from a group consisting essentially of a vacuum, an inert gas, and a reducing ambient.

9. A device, as recited in claim 1, wherein the Cu—Ca alloy surface is Cu-rich and comprises a Ca-doping level in a concentration range of 0.2 atomic % to 5 atomic %.

10. A device, as recited in claim 1, further comprising a barrier layer formed in each said at least one via.

11. A device, as recited in claim 10, wherein the barrier layer comprises tantalum (Ta).

12. A semiconductor device having a virtually voidless contaminant-reduced copper-calcium alloy surface on copper (Cu—Ca/Cu) interconnect structure for reducing electromigration therein, comprising:

a semiconductor substrate, the substrate having at least one via formed therein, each at least one via having a barrier layer formed therein; and a virtually voidless contaminant-reduced copper-calcium alloy surface on copper (Cu—Ca/Cu) interconnect structure, said interconnect structure comprising:
a Cu seed layer deposited in the at least one via;
a contaminant-reduced calcium-doped copper (Cu-Ca) alloy surface deposited on the Cu seed layer; and
at least one Cu interconnect line deposited in the at least one via and over the contaminant-reduced Cu—Ca alloy surface, the Cu seed layer comprising a plating treatment using a chemical solution for forming a Cu—Ca—X conformal layer on the Cu seed layer, X comprising at least one contaminant, the Cu—Ca—X conformal layer comprising an annealing treatment for forming the contaminant-reduced Cu—Ca alloy surface on the Cu seed layer and for facilitating forming the virtually voidless contaminant-reduced copper-calcium alloy surface on copper (Cu—Ca/Cu) interconnect structure, the barrier layer comprising tantalum (Ta), the Cu seed layer being deposited by a technique selected from a group consisting essentially of electroplating, electroless plating, chemical vapor deposition (CVD), plasma vapor deposition (PVD), plasma enhanced chemical vapor deposition (PECVD), and atomic layer deposition (ALD), the at least one interconnect line being dual inlaid, the chemical solution comprising an electroless plating solution, the electroless plating solution comprising:
a. at least one Cu salt,
b. at least one Ca salt,
C. at least one complexing agent,
d. at least one reducing agent,
e. at least one pH adjuster, and
f. at least one surfactant, the at least one contaminant being selected from a group consisting essentially of carbon (C), sulphur (S), and oxygen (O), the annealing treatment comprising a temperature range of 250° C. to 450° C. in an environment selected from a group consisting essentially of a vacuum, an inert gas, and a reducing ambient, and the contaminant-reduced Cu—Ca alloy surface being Cu-rich and comprises a Ca-doping level in a concentration range of 0.2 atomic % to 5 atomic %.

* * * * *